United States Patent
Sauer et al.

(10) Patent No.: US 10,798,837 B1
(45) Date of Patent: Oct. 6, 2020

(54) SEAMLESS SPLIT HOOD

(71) Applicant: HEWLETT PACKARD ENTERPRISE DEVELOPMENT LP, Houston, TX (US)

(72) Inventors: Keith Sauer, Houston, TX (US); Paul E. Westphall, Houston, TX (US); Kenny Huy Pham, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/397,915

(22) Filed: Apr. 29, 2019

(51) Int. Cl.
*H05K 5/02* (2006.01)
*H05K 7/14* (2006.01)

(52) U.S. Cl.
CPC .......... *H05K 5/0239* (2013.01); *H05K 5/023* (2013.01); *H05K 5/0221* (2013.01); *H05K 7/1488* (2013.01)

(58) Field of Classification Search
CPC .... H05K 5/0217; H05K 5/0221; H05K 5/023; H05K 5/0239; H05K 5/03; H05K 7/1487; H05K 7/1488; G06F 1/181; G06F 1/182
See application file for complete search history.

(56) References Cited

U.S. PATENT DOCUMENTS

| | | | | |
|---|---|---|---|---|
| 6,788,542 B2 * | 9/2004 | Rumney | .............. | H05K 7/1421 361/724 |
| 7,374,259 B2 | 5/2008 | Wu et al. | | |
| 8,472,170 B2 * | 6/2013 | Feng | ........................ | G06F 1/182 165/104.33 |
| 8,625,288 B1 | 1/2014 | Liu et al. | | |
| 8,827,384 B2 * | 9/2014 | Chen | .................... | H05K 7/1487 312/223.2 |
| 8,899,702 B2 * | 12/2014 | Mao | ...................... | H05K 7/1487 312/222 |
| 9,055,689 B2 * | 6/2015 | Yu | ........................ | H05K 5/0226 |
| 2010/0007252 A1 * | 1/2010 | Liu | ......................... | G06F 1/183 312/223.2 |
| 2016/0081217 A1 * | 3/2016 | Norton | ................... | G11C 29/00 361/679.31 |
| 2017/0280581 A1 | 9/2017 | Hesse | | |

FOREIGN PATENT DOCUMENTS

| | | | |
|---|---|---|---|
| CN | 2725978 Y | 9/2005 | |
| CN | 2791721 Y | 6/2006 | |
| CN | 208141286 U | 11/2018 | |
| FR | 1494114 A * | 9/1967 | ............. A47B 57/20 |

* cited by examiner

*Primary Examiner* — Andrew M Roersma
(74) *Attorney, Agent, or Firm* — Hewlett Packard Enterprise Patent Department

(57) ABSTRACT

This disclosure describes designs for chassis with multiple hoods and methods for removing those hoods. A base portion of a chassis includes an opening, a base ridge comprising a first section and a second section, an L-shaped cutout disposed along the first section of the base ridge, and a T-shaped cutout disposed along the second section of the base ridge. The T-shaped cutout includes a front recess and a rear recess.

17 Claims, 15 Drawing Sheets

SEAMLESS SPLIT HOOD

BACKGROUND

Many electrical devices, such as servers, are encased in chassis. Servers can be used to provide a wide array of services to client computers via computer networks such as the Internet. For example, web servers provide web pages to clients via the Internet, mail servers provide email services, and file servers both provide downloadable files and store uploaded files.

Several different form factors exist for servers. A tower server is typically a freestanding unit that is suitable for contexts where a single server can manage a projected workload. Rack servers are more compact than tower servers and are therefore suitable for contexts where multiple servers are stored in close proximity (e.g., in a server farm), but are still self-contained. Blade servers are more compact than rack servers, but generally share components such as switches, ports, and power connectors.

BRIEF DESCRIPTION OF THE DRAWINGS

Various features and advantages will become apparent from the following description, given by way of example only, which is made with reference to the accompanying drawings, of which.

DETAILED DESCRIPTION

Some types of electrical devices that include chassis, such as rack servers and blade servers, can be configured to work together in large groups (e.g., server farms). Some server chassis are designed to slide into racks so that many servers can be stored in a relatively small space. A rack typically supports the weight of each server positioned therein and prevents the weight of servers that are placed higher in the rack from pressing down on servers that are placed lower in the rack.

Rack servers include components such as processors, motherboards, dual in-line memory modules (DIMMs), buses, hard drives, heat sinks, fans, and power supplies. Blade servers include processors, motherboards, buses, hard drives, heat sinks, and DIMMs, but typically share components such as power supplies and fans.

Even in robust servers, individual components occasionally have to be replaced for system repairs and upgrades. Also, some internal server components may have to be serviced on occasion. For this reason, a server chassis may include a removable hood so that the components stored therein can be accessed easily. When the hood is removed, technicians can access components that are to be serviced, upgraded, or replaced.

Apparatuses of the present disclosure provide several advantages over existing chassis and hood designs. For example, apparatuses disclosed herein provide a split chassis hood that allows technicians to access interior components of a server without completely removing the server from the rack such that the rack continues to support the weight of the server while the components are serviced or replaced. Furthermore, apparatuses disclosed herein allow technicians to access interior components without deactivating the server or unplugging any cables. Thus, apparatuses disclosed herein allow hot-pluggable components to be added or removed from the server without interrupting the server's operation and without taking the server offline. In addition, apparatuses disclosed herein provide split hoods that reduce electromagnetic interference (EMI) relative to other possible split-hood designs. Also, apparatuses disclosed herein allow a technician remove multiple removable hood sections after operating single hood latch. These and other advantages will be evident in the discussion that follows.

Servers are one example of a product in which these and other advantages of the apparatuses described herein are helpful. For this reason, many of the examples and figures provided herein refer to server chassis. However, the examples provided herein are for illustrative purposes only. Persons of skill in the art will recognize that the apparatuses described herein are useful for many other types of products that include a chassis (or another type of enclosure) with hoods.

Figure 1:
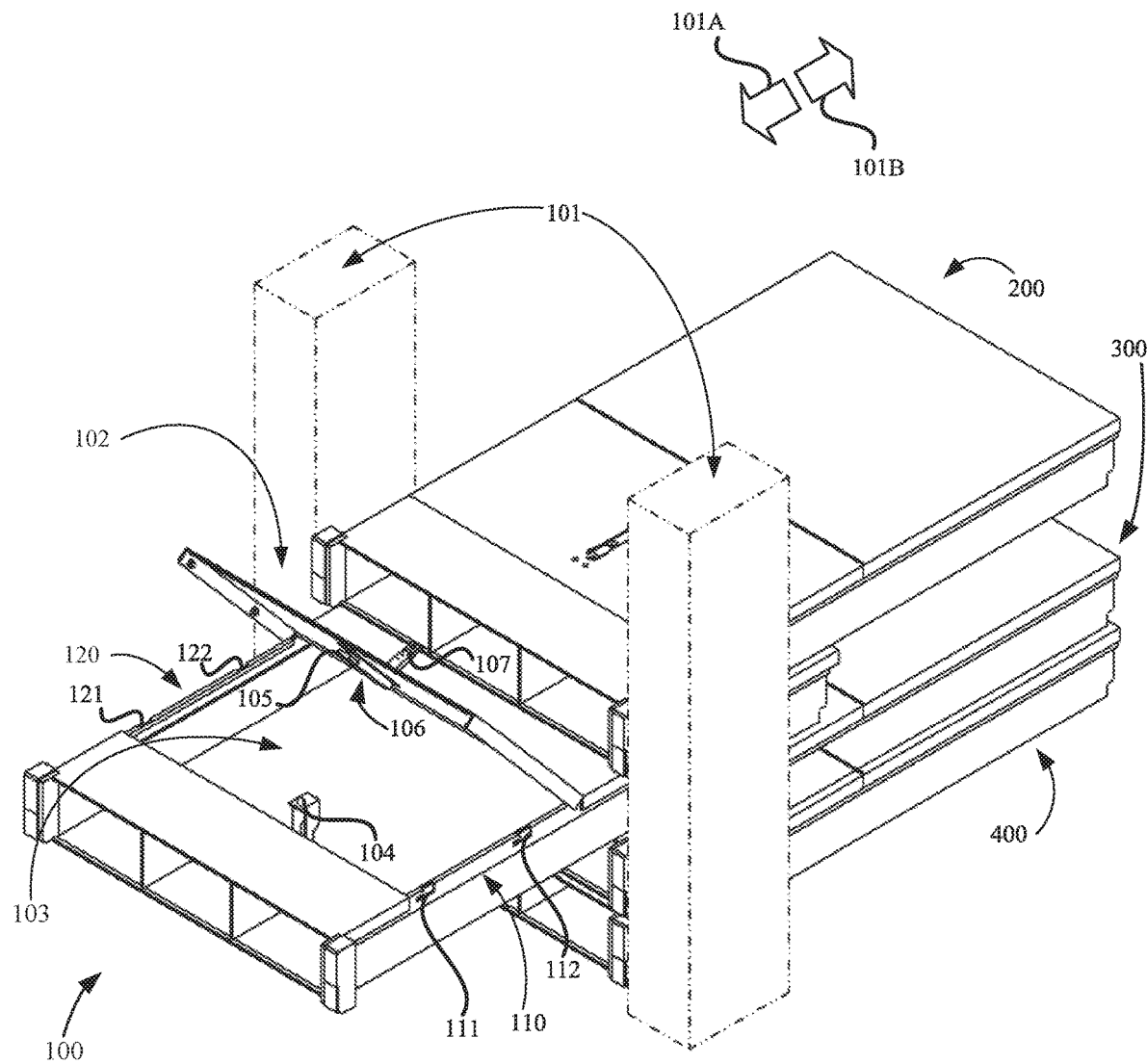
FIG. 1 illustrates a perspective view of a server chassis arrangement in a rack, according to one example.

FIG. 1 illustrates a perspective view of a server chassis arrangement in a rack, according to one example. As shown, the server chassis 100, the server chassis 200, the server chassis 300, and the server chassis 400 are positioned in a rack 101. The server chassis 200, 300, 400 are fully inserted into the rack 101. By contrast, the server chassis 100 has been slid forward to partially extract the server chassis 100 from the rack 101. (In this example, forward direction 101A and backward direction 101B are indicated by arrows as shown.) The first hood 102 has been opened and rotated upward to reveal an opening 103, a first section of a base ridge 110, a first section of a base ridge 120, and a pin 104 configured to engage with an actuator 105 of a hood latch 106. The hood latch 106 also includes a handle 107. The handle 107 is shown in a handle-open position. The base ridge 110 includes an L-shaped cutout 111 and another L-shaped cutout 112, while the base ridge 120 includes an L-shaped cutout 121 and an L-shaped cutout 122 (though the L-shaped cutouts 121, 121 are not fully visible in FIG. 1). The hood latch 106 is positioned proximal to the front edge of the first hood 102 of the chassis 100 so that the first hood 102 can be opened as shown while the server chassis 100 is positioned as shown within the rack 101. Although the server chassis 100 has been partially extracted from the rack 101, the rack 101 still supports the weight of the server chassis 100 while the server chassis 100 is positioned as shown.

Note that the hood latch 106 may be affixed to the first hood 102 in an orientation that is different from the orientation shown in FIG. 1. For example, the hood latch 106 may be designed and oriented in one of the manners suggestion in U.S. patent application Ser. No. 16/393,513 ("Rotated Hood Latch"), which is hereby incorporated by reference.

Figure 2:
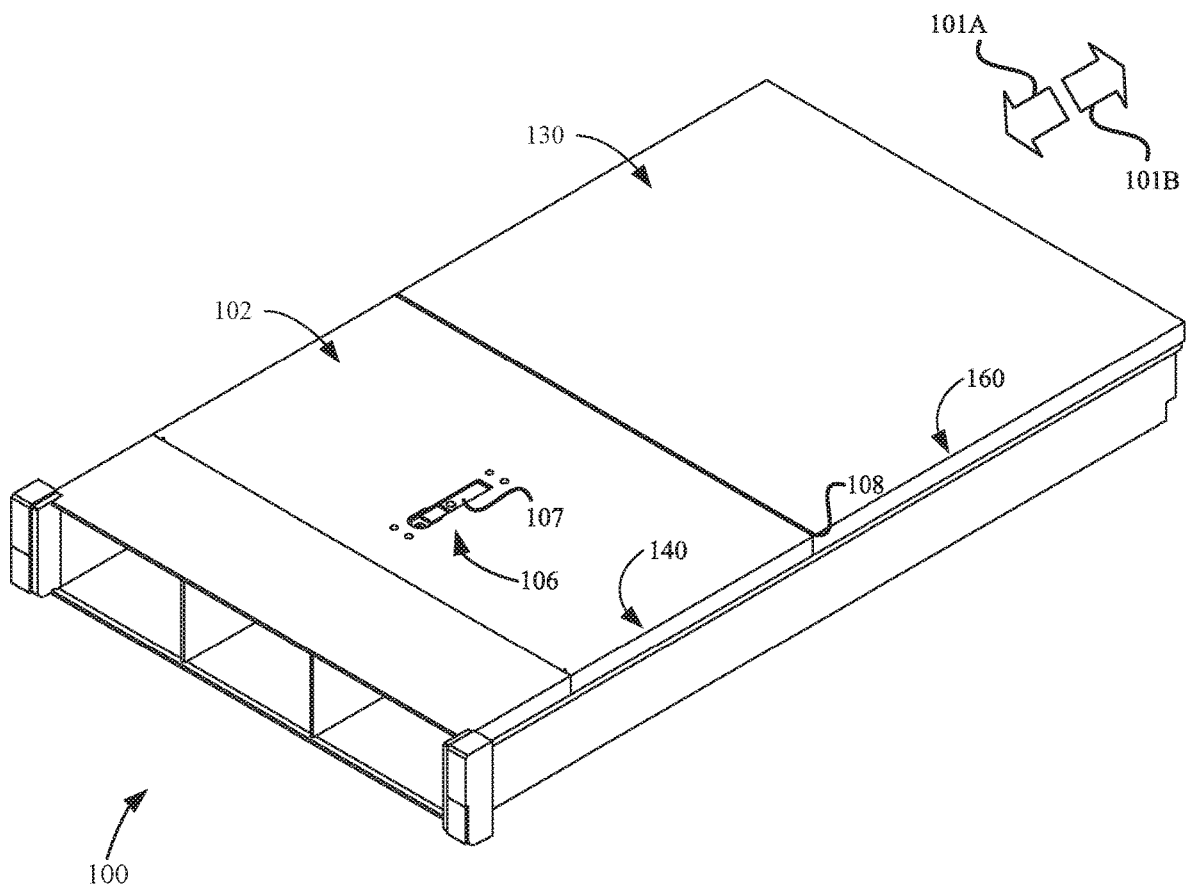
FIG. 2 illustrates a perspective view of a server chassis when a first hood and a second hood are both in closed positions, according to one example.

FIG. 2 illustrates a perspective view of the server chassis 100 when the first hood 102 and the second hood 130 are both in closed positions, according to one example. The position of the first hood 102 as shown is referred to herein as the first-hood-closed position, while the position of the second hood 130 as shown is referred to herein as the forward-closed position. The first hood 102 and the second hood 130 are resting in a cross-sectional plane of the opening 103 (shown in FIG. 1). The first hood 102 overlays a first portion of the opening 103, while the second hood 130 overlays a second portion of the opening 103.

The handle 107 of the hood latch 106 is also shown in a closed position (referred to herein as a handle-closed position). When the first hood 102 is in the first-hood closed position as shown, a ridge 140 of the first hood 102 overlays a first section of the base ridge 110 (shown in FIG. 1) of the server chassis 100. Also, when the second hood 130 is in the forward-closed position, a ridge 160 of the second hood 130 overlays a second section of the base ridge 110. At junction 108, a J-shaped flange (shown in detail in later figures) along the back edge of the first hood 102 interlocks with a flange (shown in detail in later figures) along the front edge of the second hood 130.

Forms (shown in later figures) on the inner side of the ridge 140 rest in recesses of the L-shaped cutouts 111, 112 (shown in FIG. 1), respectively, and engage with the L-shaped cutouts 111, 112 to prevent the first hood 102 from moving in a removal direction that is orthogonal to a cross-sectional plane of the opening 103 when the first hood 102 is in the first-hood-closed position. These aspects are shown and described in greater detail in subsequent figures, but are mentioned here to provide context.

Similarly, a form (shown in later figures) on the inner side of ridge 160 rests in a front recess of a T-shaped cutout (shown in later figures) on a second section of the base ridge 110 (shown in FIG. 1) when the second hood is in the forward-closed position and engages with the T-shaped cutout to prevent the second hood 130 from moving in the removal direction. These aspects are shown and described in greater detail in subsequent figures, but are mentioned here to provide context.

When the handle 107 of the hood latch 106 is rotated upward into a handle-open position, the actuator 105 (shown in FIG. 1) engages with the pin 104 (shown in FIG. 1) and causes the first hood 102 and the second hood 130 to slide backward (i.e., the backward direction 101B). The resulting positions of the handle 107, the first hood 102, and the second hood 130 are shown in FIG. 3.

Figure 3:
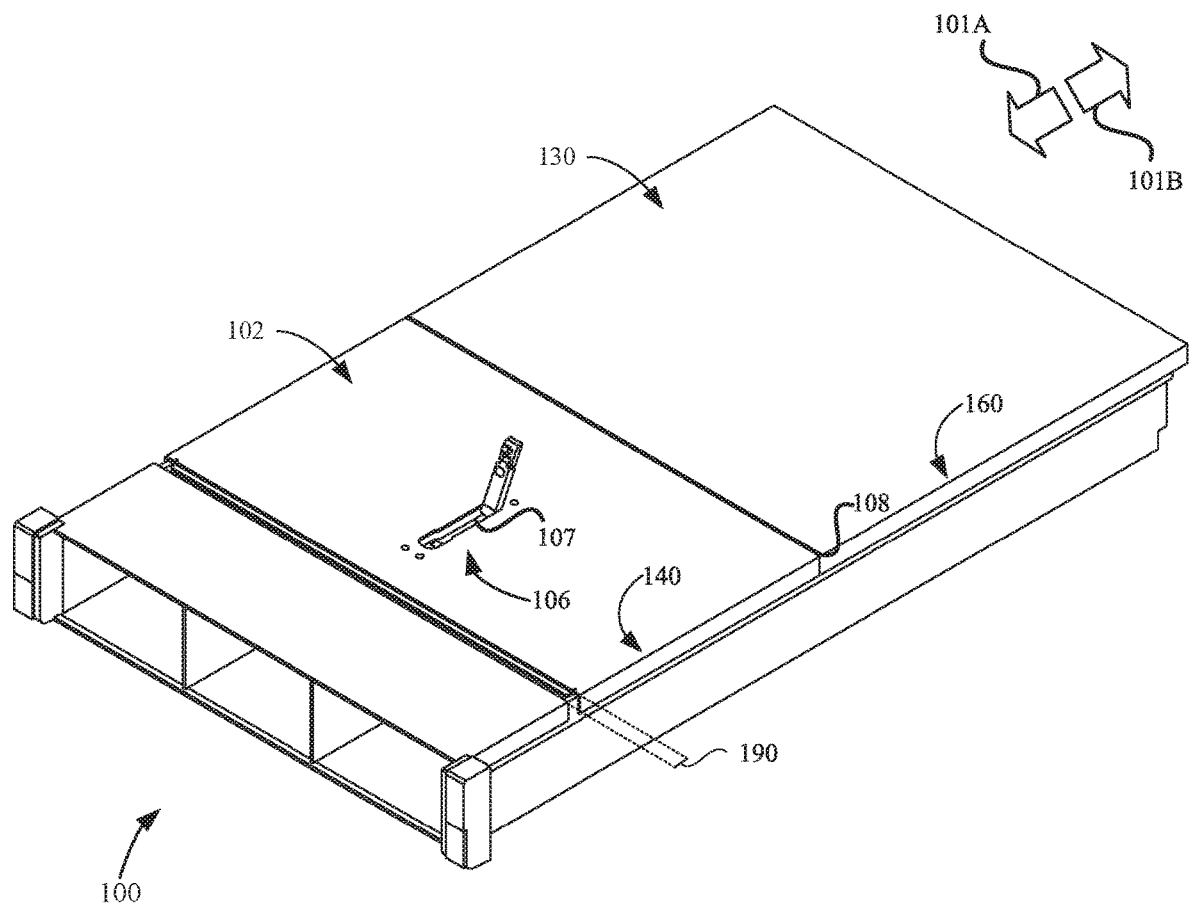
FIG. 3 illustrates a perspective view of a server chassis when a handle of a hood latch has been moved to a handle-open position, according to one example.

FIG. 3 illustrates a perspective view of the server chassis 100 when the handle 107 of the hood latch 106 has been moved to a handle-open position, according to one example. As shown, the handle 106 is in the handle-open position. As a result, the first hood 102 has been shifted backwards in the cross-sectional plane of the opening 103 (shown in FIG. 1) by a movement distance 190. When the first hood 102 shifted backward, the back edge of the first hood 102 also pushed the front edge of the second hood 130 at the junction 108. As a result, the second hood 130 is also shifted backward in the cross-sectional plane of the opening 103 by the movement distance 190.

The position of the first hood 102 shown in FIG. 3 is referred to herein as the first-hood open position because the forms (shown in later figures) on the inner side of the ridge 140 are moved out of the recesses (shown in later figures) of the L-shaped cutouts when the first hood 102 slides backward by the movement direction. When the forms are not resting in the recesses, the L-shaped cutouts 111, 112 do not engage with the forms to prevent movement of the first hood 102 in the removal direction. As a result, the front edge of the first hood 102 can be lifted upward to cause the first hood 102 to rotate about an axis parallel to the back edge of the first hood 102 when the first hood 102 is in the first-hood-open position. These aspects are shown and described in greater detail in subsequent figures, but are mentioned here to provide context.

The position of the second hood 130 shown in FIG. 3 is referred to herein as the backward-closed position because the second hood 130 has shifted backward by the movement distance, thereby causing the form (on the inner side of ridge 160) that rests in the front recess of the T-shaped cutout (on the second section of the base ridge 110 shown in FIG. 1) to slide backward into a rear recess of the T-shaped cutout. Because the form rests in the rear recess, the T-shaped cutout engages with the form (on the inner side of ridge 160) to prevent the second hood 130 from moving in the removal direction when the second hood 130 is in the backward-closed position. These aspects are shown and described in greater detail in subsequent figures, but are mentioned here to provide context.

Thus, when the first hood 102 is in the first-hood open position and the second hood 130 is in the backward-closed position as shown in FIG. 3, the first hood 102 can be opened via an upward rotation. However, the second hood 130 will remain fast. The positions of the first hood 102 and the second hood 130 that result when the first hood 102 is rotated are shown in FIG. 4.

Figure 4:
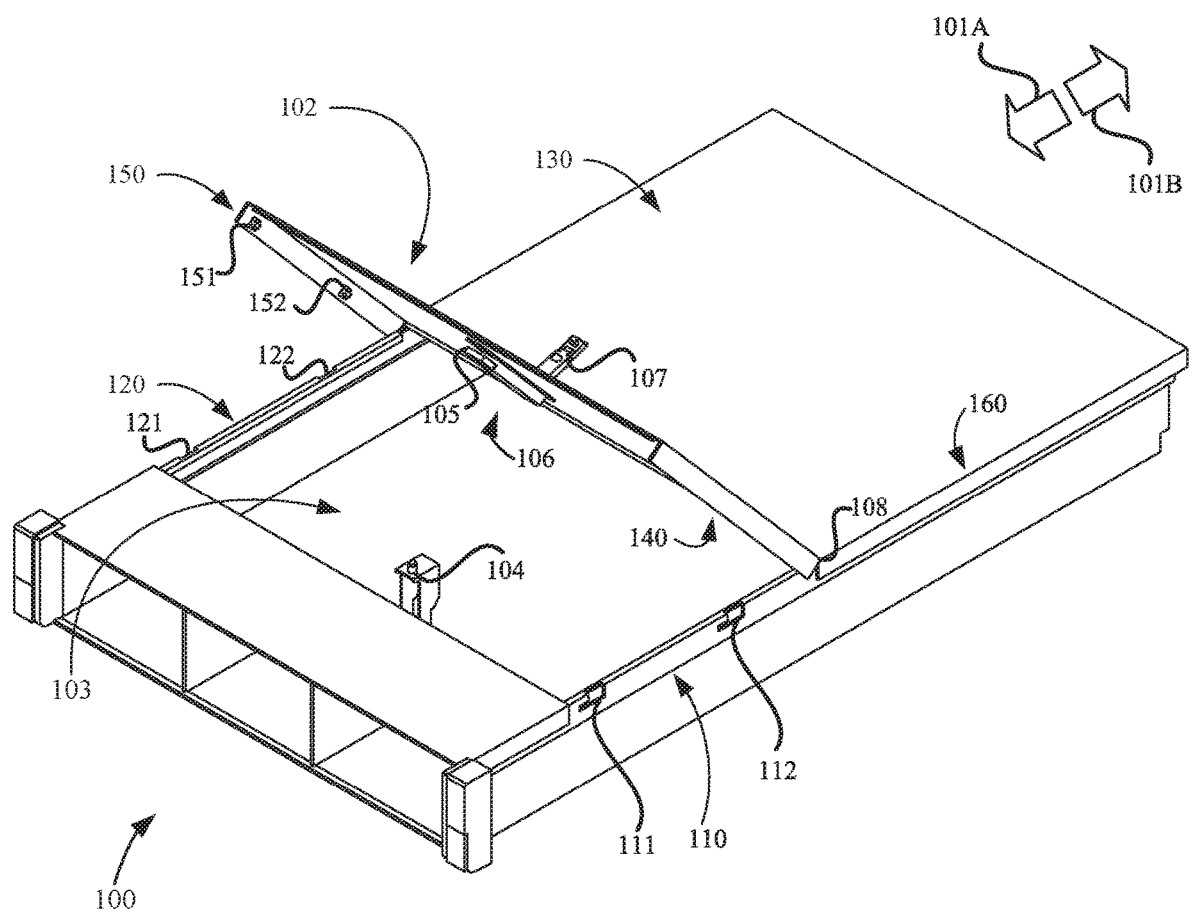
FIG. 4 illustrates a perspective view of a server chassis when a first hood has been rotated upward about an axis parallel to a back edge of the first hood, according to one example.

FIG. 4 illustrates a perspective view of the server chassis 100 when the first hood 102 has been rotated upward about an axis parallel to the back edge of the first hood 102, according to one example. As shown, when the first hood 102 is rotated thus, the portion of the opening 103 that was covered by the first hood 102 in FIG. 2, the pin 104, and the actuator 105 are exposed. Furthermore, the base ridge 110 and the L-shaped cutouts 111, 112 are visible. The base ridge 120 and the top sides of L-shaped cutouts 121, 122 are also visible, as are the forms 151, 152 that are disposed along the inner side of ridge 150. The handle 107 is still in the handle-open position. Although the first hood 102 has been rotated upward, the second hood 130 remains in the backward-closed position. When the first hood 102 of the server chassis 100 has been rotated open as shown, components stored beneath the exposed portion of the opening 103 can be accessed by a technician.

Once the first hood 102 has been rotated far enough for cause a flange (shown in detail in later figures) along the front edge of the second hood 130 at junction 108 to emerge out of a concave region partially enclosed by a J-shaped flange (shown in detail in later figures) along the back edge of the first hood 102, the first hood 102 can be separated from the second hood 130 by pulling the back edge of the first hood 102 away from the front edge of the second hood 130. These aspects are shown and described in greater detail in subsequent figures, but are mentioned here to provide context.

Once the first hood 102 has been separated from the second hood 130, the second hood 130 can be removed in the following manner. First, the second hood 130 is slid forward in the cross-sectional plane of the opening 103 by a distance that is less than the movement distance 190 (shown in FIG. 3) so that a form on the inner side of ridge 160 that rests in a rear recess of a T-shaped cutout (on a second section of the base ridge 110 which is overlaid by ridge 160 in FIG. 2) when the second hood 130 is in the backward-closed position moves out of the rear recess. However, the second hood 130 is not slid so far that the form moves into a front recess of the T-shaped cutout. Rather, the form is moved clear of both the front recess and the rear recess so that the form does not engage with the T-shaped cutout to prevent the second hood 130 from moving in the removal direction. When the second hood 130 is positioned such that the form is clear of both the front recess and the rear recess, the second hood 130 is said to be in the second-hood-open position. When in the second-hood-open position, the second hood 130 can be lifted off in the removal direction. These aspects are shown and described in greater detail in subsequent figures, but are mentioned here to provide context.

Figure 5:
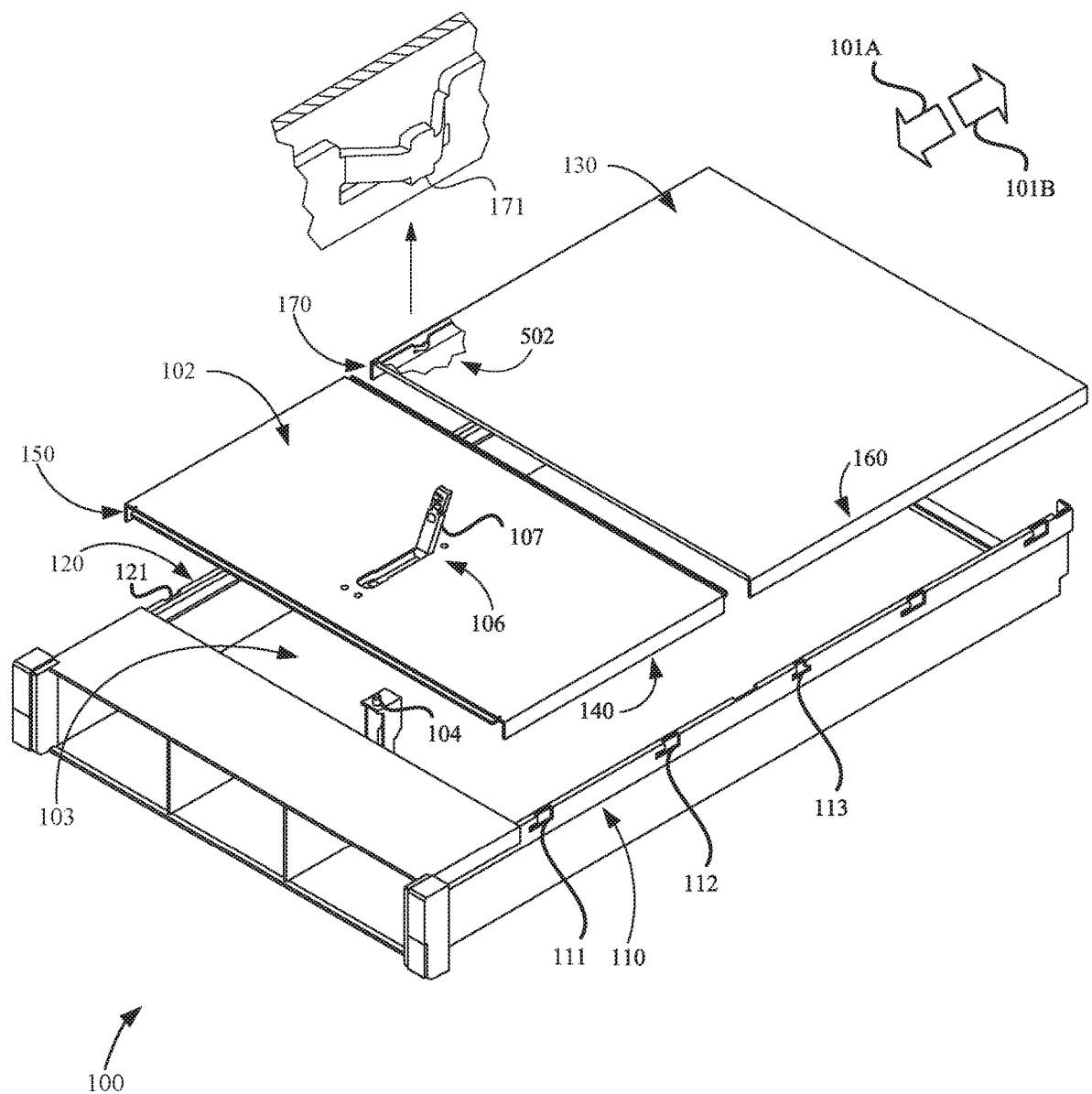
FIG. 5 illustrates a perspective view of a server chassis when a first hood and a second hood are moved in a removal direction, according to one example.

FIG. 5 illustrates a perspective view of the server chassis 100 when the first hood 102 and the second hood 130 are moved in a removal direction, according to one example. As shown, the first hood 102 and the second hood 130 have both been moved upward in a removal direction to expose more features of the server chassis 100. Specifically, with the second hood 130 removed, a second section of the base ridge 110 is exposed and a second portion of the opening 103 that was covered by the second hood 130 in FIG. 2 is visible. The second section of the base ridge 110 includes a T-shaped cutout 113 that engages with a form on the inner side of ridge 160 to prevent the second hood 130 from moving in the removal direction when the second hood 130 is in the forward-closed position or the backward-closed position. A form 171 (shown in the cutaway viewing area 502) on the inner side of the ridge 170 of the second hood 130 also engages with a similar T-shaped cutout (shown in later figures) on a second section of the base ridge 120 to prevent the second hood 130 from moving in the removal direction when the second hood 130 is in the forward-closed position or the backward-closed position. The portion of the server chassis 100 that remains after the first hood 102 and the second hood 130 have been removed is referred to herein as the base portion of the server chassis 100.

Figure 6:
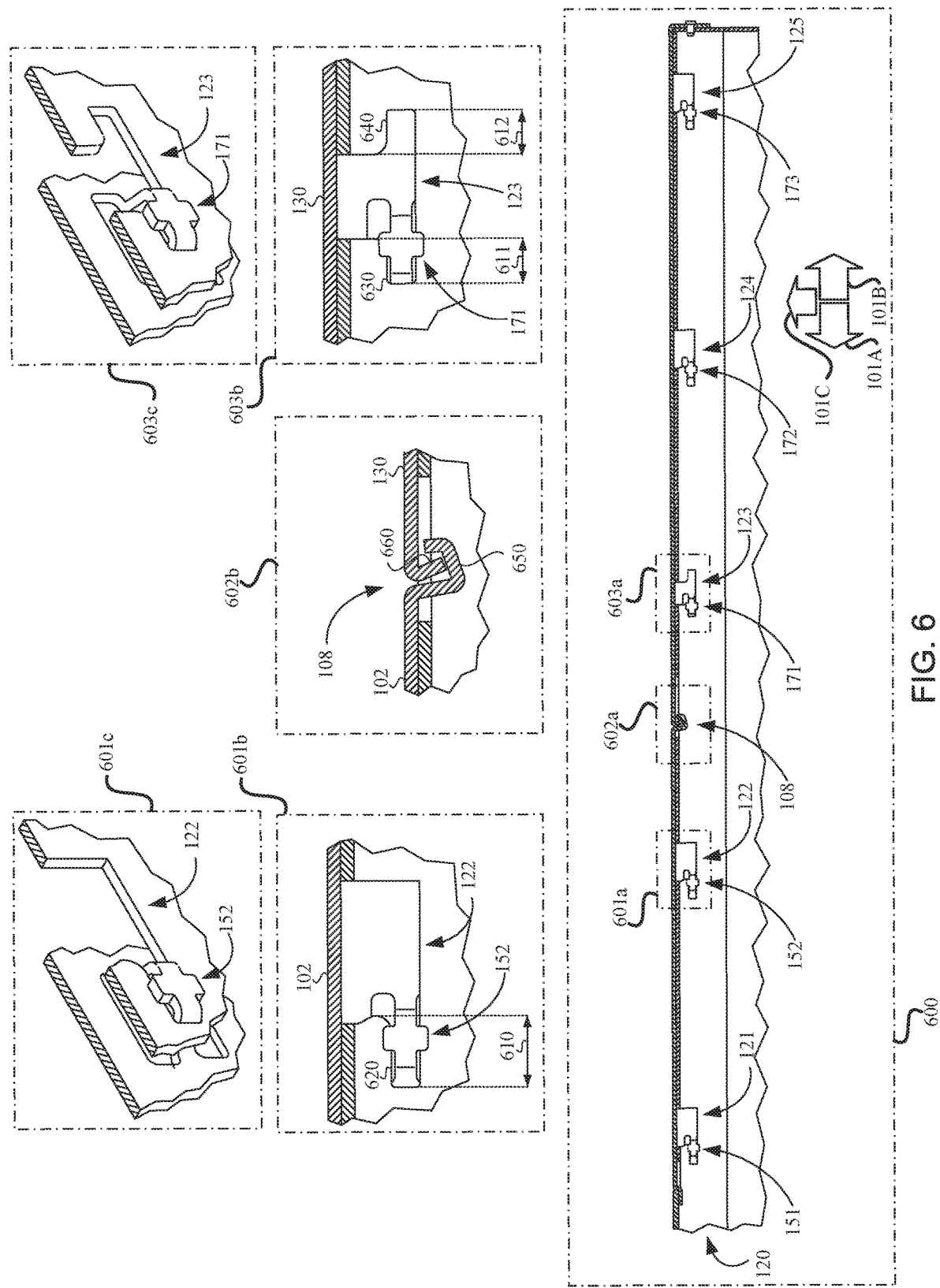
FIG. 6 provides a partial cutaway view of a server chassis sliced along the inner side of a base ridge when the first hood is in a first-hood-closed position and a second hood is in a forward-closed position, according to an example.

FIG. 6 provides a partial cutaway view 600 of the server chassis 100 sliced along the inner side of the base ridge 120 when the first hood 102 is in the first-hood-closed position and the second hood 130 is in the forward-closed position, according to an example.

The magnified viewing area 601b is an enlarged representation of the viewing area 601a. As shown in the partial cutaway view 600, the form 152 (which lies on the inner side of ridge 150, as shown in FIG. 4) is positioned inside the L-shaped cutout 122 (which lies on base ridge 120, as shown in FIG. 4). As shown in the magnified viewing area 601b, the form 152 rests in a recess 620 of the L-shaped cutout 122, thereby preventing movement of the form 152 (and the first hood 102) in the removal direction 101C. The width 610 is one dimension of the recess 620. The magnified perspective viewing area 601c provides a perspective view of the L-shaped cutout 122 and the form 152 to further facilitate visualization of how the form 152 rests in the recess 620 when the first hood 102 is in the first-hood-closed position.

The magnified viewing area 603b is an enlarged representation of the viewing area 603a. As shown in the partial cutaway view 600, the form 171 (which lies on the inner side of ridge 170) is positioned inside the T-shaped cutout 123 (which lies on base ridge 120, as shown in FIG. 4). As shown in the magnified viewing area 603b, the form 171 rests inside a front recess 630 of the T-shaped cutout 123, thereby preventing movement of the form 171 (and the second hood 130) in the removal direction 101C. The T-shaped cutout also includes a rear recess 640. The width 611 is one dimension of the front recess, while the width 612 is one dimension of the rear recess 640. The width 611 and/or the width 612 may be less than the width 610. For example, a ratio of the sum of the width 611 and the width 612 to the width 610 may be between 0.85 and 1.20.

The magnified perspective viewing area 603c provides a perspective view of the T-shaped cutout 123 and the form 171 to further facilitate visualization of how the form 171 rests in the front recess 630 when the second hood 130 is in the forward-closed position.

The magnified viewing area 602b is an enlarged representation of the viewing area 602a. As shown in the partial cutaway view 600, viewing area 602a highlights the junction 108 (e.g., as shown in FIG. 2). As shown in the magnified viewing area 602b, there is a J-shaped flange 650 on the back edge of the first hood 102. In some examples, the J-shaped flange 650 may extend across the full length of the back edge of the first hood 102. A flange 660 on the front edge of the second hood 130 rests inside a concave region partially enclosed by the J-shaped flange 650. In some examples, the flange 660 may extend across the full length of the front edge of the second hood 130.

Figure 7:
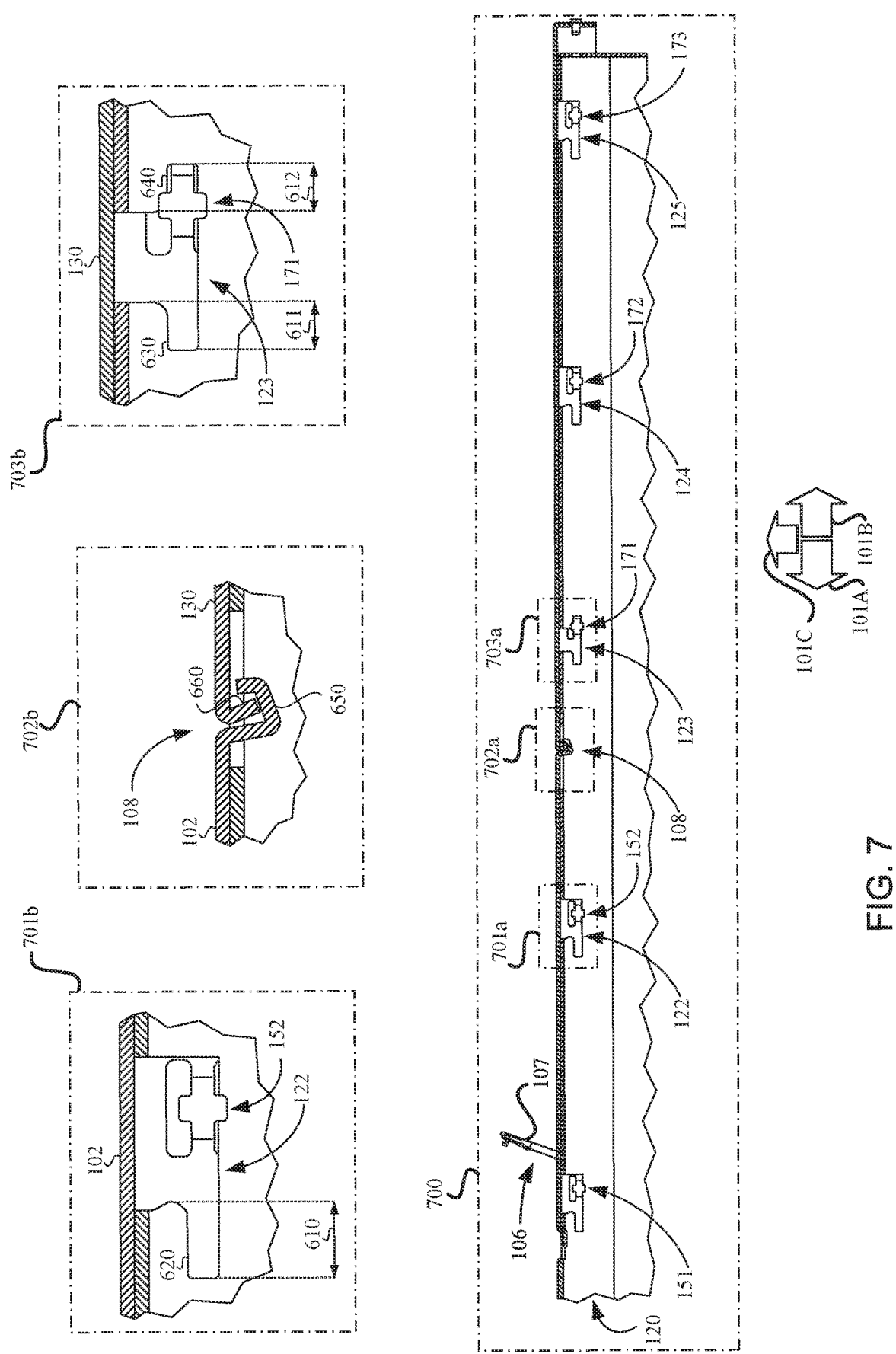
FIG. 7 provides a partial cutaway view of a server chassis sliced along the inner side of a base ridge when a first hood is in a first-hood-open position and a second hood is in a backward-closed position, according to an embodiment.

FIG. 7 provides a partial cutaway view 700 of the server chassis 100 sliced along the inner side of the base ridge 120 when the first hood 102 is in the first-hood-open position and the second hood 130 is in the backward-closed position, according to an embodiment.

The magnified viewing area 701b is an enlarged representation of the viewing area 701a. As shown in the partial cutaway view 700, the form 152 (which lies on the inner side of ridge 150, as shown in FIG. 4) is positioned inside the L-shaped cutout 122 (which lies on base ridge 120, as shown in FIG. 4). As shown in the magnified viewing area 701b, the form 152 is clear of the recess 620 of the L-shaped cutout 122 because the form 152 has moved in the backward direction 101B by the movement distance 190 (shown in FIG. 3) within the L-shaped cutout 122 relative to FIG. 6. As a result, movement of the form 152 (and the first hood 102) in the removal direction 101C is no longer prevented by the L-shaped cutout 122.

The magnified viewing area 702b is an enlarged representation of the viewing area 702a. As shown in the partial cutaway view 700, viewing area 702a highlights the junction 108 (e.g., as shown in FIG. 2). As shown in the magnified viewing area 702b, the flange 660 on the front edge of the second hood 130 still rests inside the concave region partially enclosed by the J-shaped flange 650 even though the first hood 102 and the second hood 130 were shifted in the backward direction 101B by the movement distance. When the handle 107 of the hood latch 106 was rotated from the handle-closed position to the handle-open position, the first hood 102 shifted backward by the movement distance. When the first hood 102 shifted, the back edge of the first hood 102 pushed against the front edge of the second hood 130 such that the second hood 130 also shifted backward by the movement distance.

The magnified viewing area 703b is an enlarged representation of the viewing area 703a. As shown in the partial cutaway view 700, the form 171 (which lies on the inner side of the ridge 170 shown in FIG. 5) is positioned inside the T-shaped cutout 123 (which lies on base ridge 120). As shown in the magnified viewing area 703b, the form 171 rests in the rear recess 640 of the T-shaped cutout 123 because the form 171 has moved in the backward direction 101B by the movement distance 190 (shown in FIG. 3) within the T-shaped cutout 123 relative to FIG. 6. As a result, movement of the form 171 (and the second hood 130) in the removal direction 101C is prevented by the T-shaped cutout 123.

Figure 8:
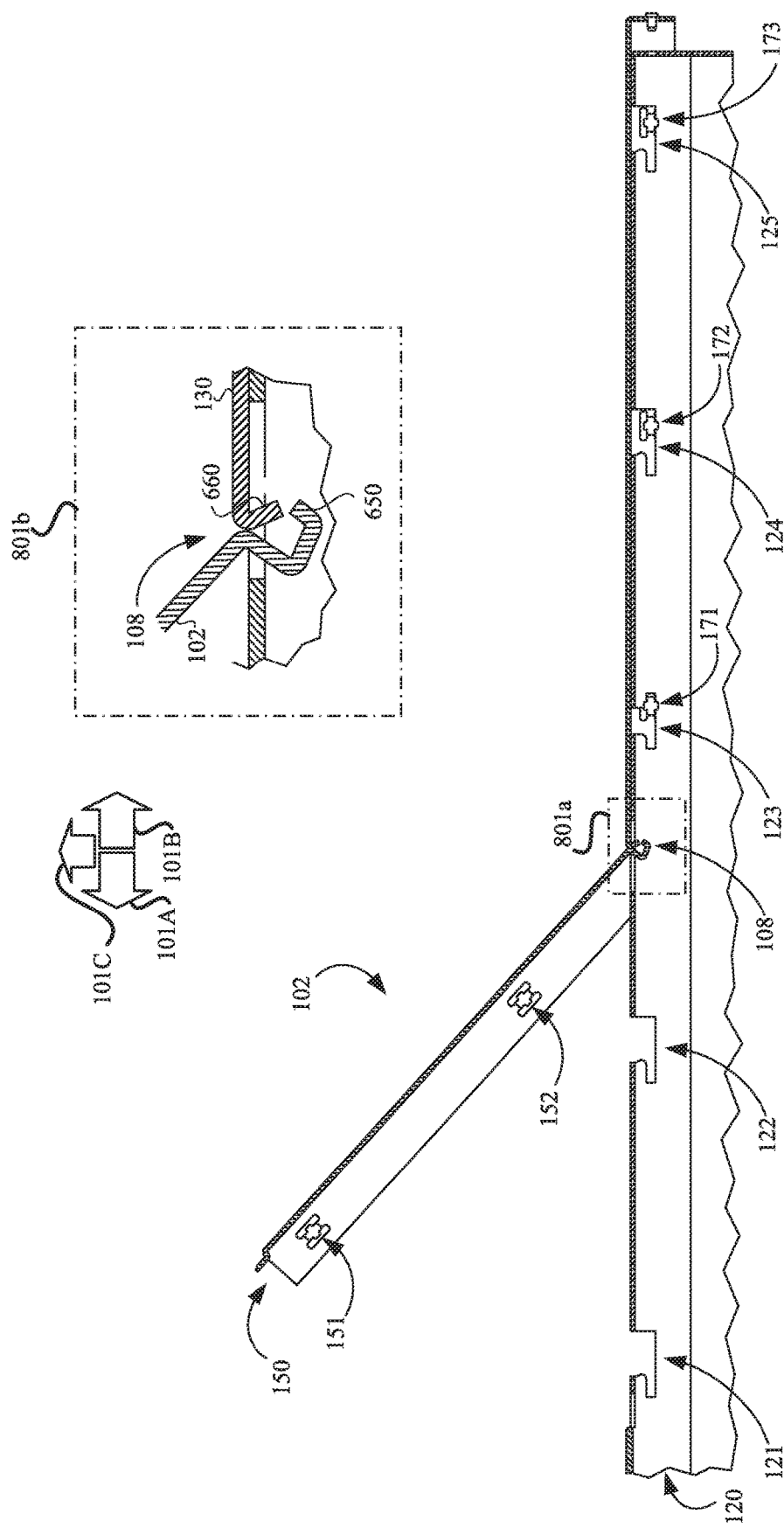
FIG. 8 provides a partial cutaway view of a server chassis sliced along the inner side of a base ridge when a first hood has been rotated upward about an axis parallel to the back edge of the first hood and a second hood remains in a backward-closed position, according to an example.

FIG. 8 provides a partial cutaway view 800 of the server chassis 100 sliced along the inner side of the base ridge 120 when the first hood 102 has been rotated upward about an axis parallel to the back edge of the first hood 102 and the second hood 130 remains in the backward-closed position, according to an example.

As shown, the form 151 and the form 152 on the ridge 150 of the first hood 102 have been lifted out of the L-shaped cutout 121 and the L-shaped cutout 122, respectively. However, the form 171 continues to rest in the rear recess 640 (shown in FIG. 7) of the T-shaped cutout 123 such that the second hood 130 does not move in the removal direction 101C while the first hood 102 is rotated.

The magnified viewing area 801b is an enlarged representation of the viewing area 801a. As shown in the partial cutaway view 800, the J-shaped flange 650 has rotated with the first hood 102 about the axis that is parallel to the back edge of the first hood 102. As a result, the flange 660 on the front edge of the second hood 130 no longer rests in the concave region partially enclosed by the J-shaped flange 650. Thus, after the first hood 102 has been rotated as shown, the first hood 102 can be pulled away from the second hood 130 (e.g., in the forward direction 101A) without causing the J-shaped flange 650 to engaging the flange 660 and pull the second hood 130 along with the first hood 102.

Figure 9:
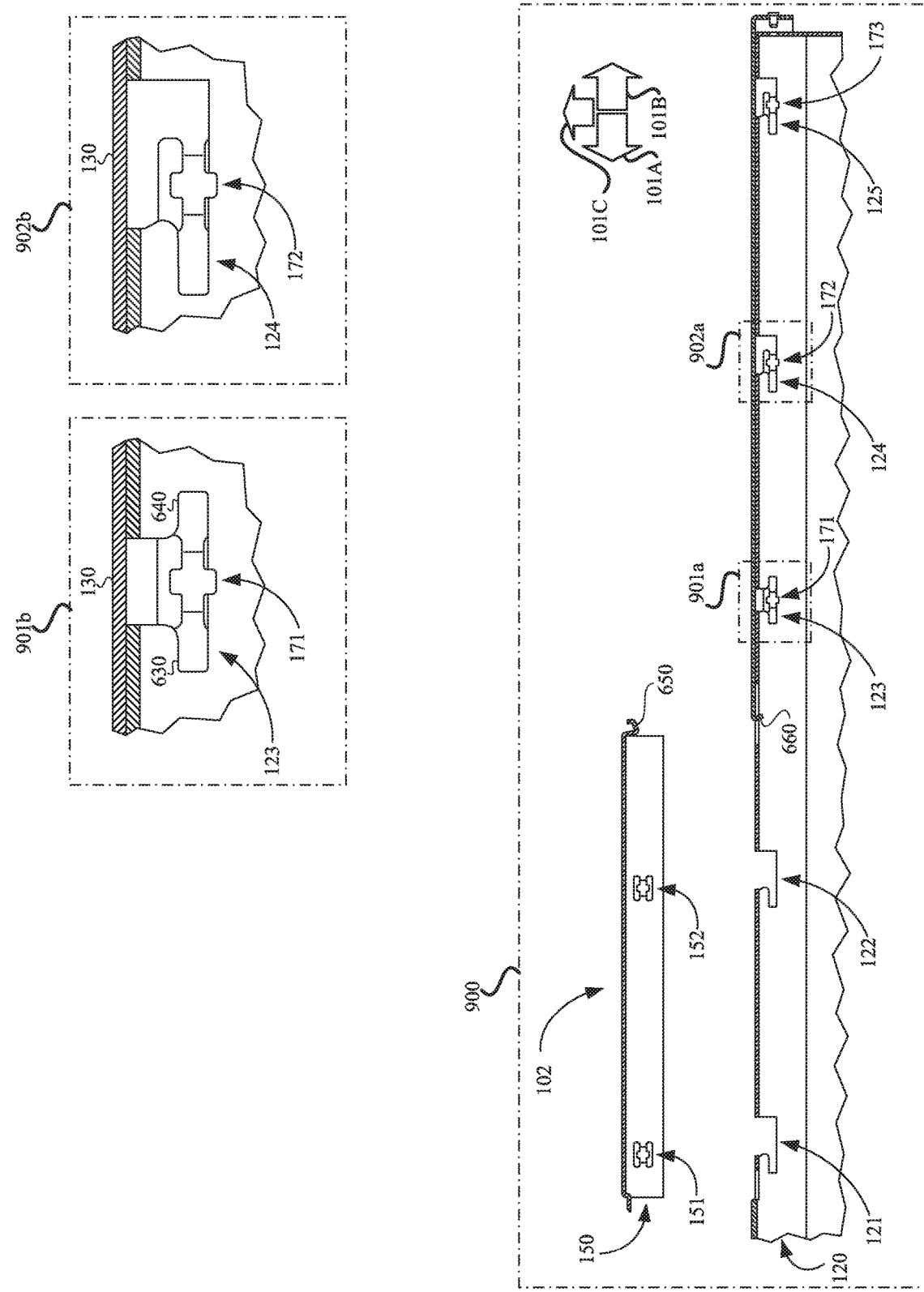
FIG. 9 provides a partial cutaway view of a server chassis sliced along the inner side of a base ridge when a first hood has been removed and a second hood is in a second-hood-open position, according to an example.

FIG. 9 provides a partial cutaway view 900 of the server chassis 100 sliced along the inner side of the base ridge 120 when the first hood 102 has been removed and the second hood 130 is in the second-hood-open position, according to an example.

As shown in the partial cutaway view 900, the first hood 102 has been removed. In addition, the second hood 130 has been shifted in the forward direction 101A by a distance smaller than the movement distance 190 (e.g., no greater than half of the movement distance 190) relative to FIG. 8.

The magnified viewing area 901b is an enlarged representation of the viewing area 901a. As shown in the partial cutaway view 900, the form 171 has been moved forward out of the rear recess 640 such that the form 171 rests in neither the front recess 630 nor the rear recess 640. As a result, the T-shaped cutout 123 no longer prevents the form 171 (and the second hood 130) from moving in the removal direction 101C.

The magnified viewing area 902b is an enlarged representation of the viewing area 902a. As shown in the partial cutaway view 900, the form 172 does not rest in the recess of the L-shaped cutout 124. As a result, the L-shaped cutout 124 does not prevents the form 172 (and the second hood 130) from moving in the removal direction 101C. For similar reasons, the L-shaped cutout 125 does not prevent the form 173 (and the second hood 130) from moving in the removal direction.

Figure 10:
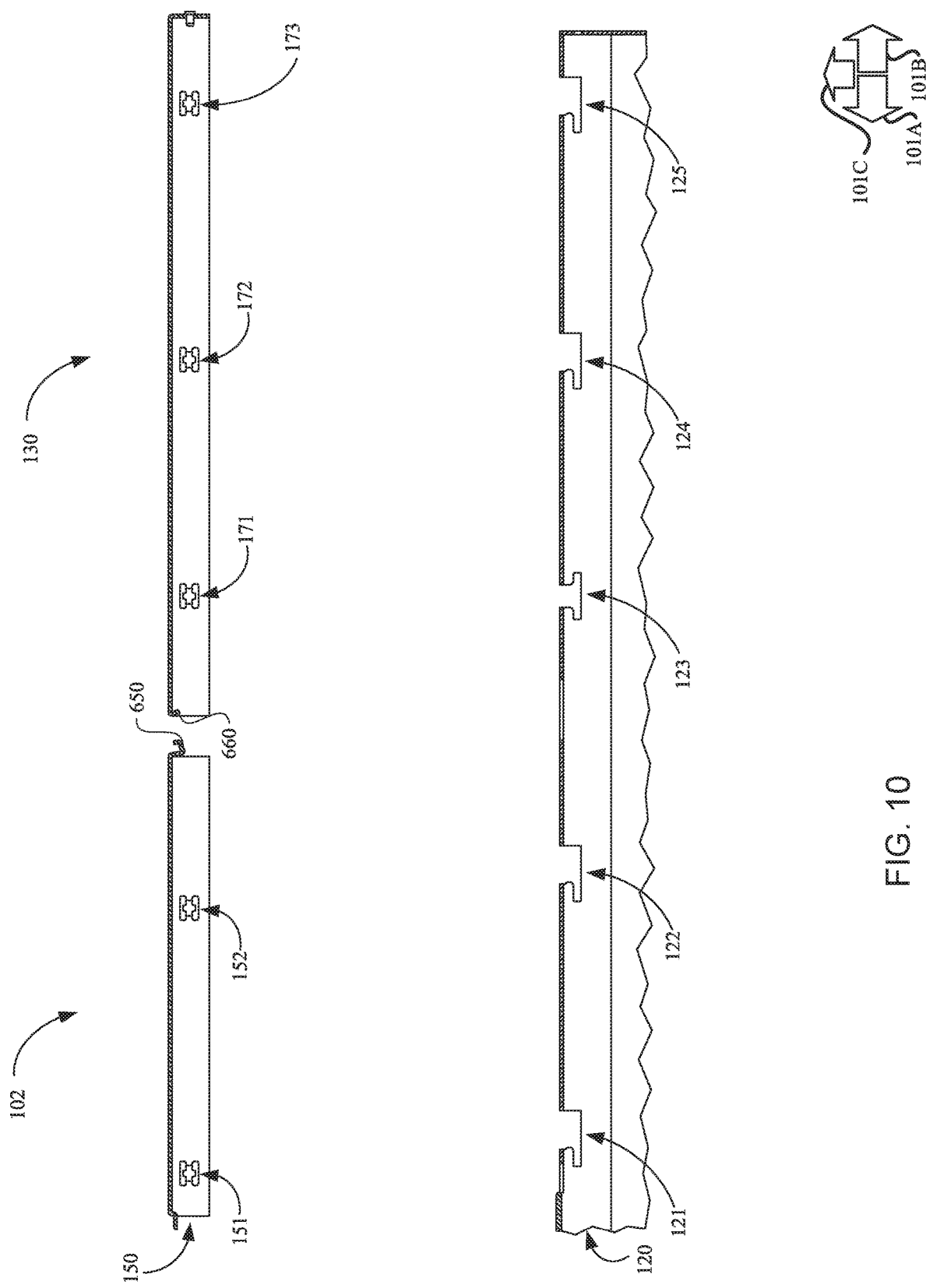
FIG. 10 provides a partial cutaway view of a server chassis sliced along the inner side of a base ridge a when a first hood and a second hood have been removed, according to an example.

FIG. 10 provides a partial cutaway view of the server chassis 100 sliced along the inner side of the base ridge 120 when the first hood 102 and the second hood 130 have been removed, according to an example.

As shown, the form 151 and the form 152 are not resting in the L-shaped cutout 121 and the L-shaped cutout 122, respectively. Similarly, the form 171 is not resting in the T-shaped cutout 123. Also, the form 172 and the form 173 are not resting in the L-shaped cutout 124 and the L-shaped cutout 125, respectively.

Figure 11:
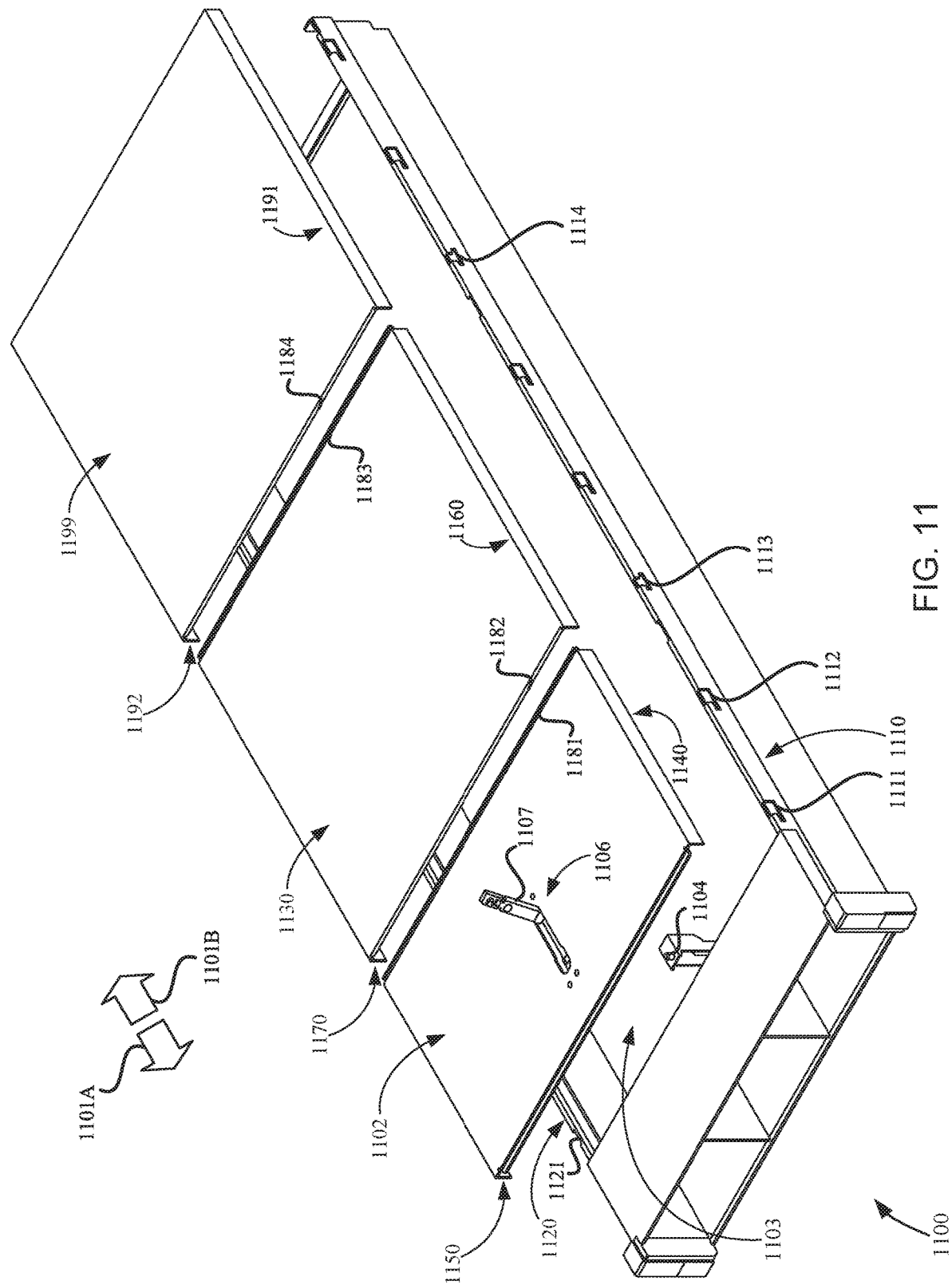
FIG. 11 illustrates a perspective view of a server chassis when a first hood, a second hood, and a third hood have been removed, according to one example.

FIG. 11 illustrates a perspective view of a server chassis 1100 when a first hood 1102, a second hood 1130, and a third hood 1199 have been removed, according to one example. Unlike the examples described in FIGS. 1-10, the example shown in FIG. 11 includes three hoods to demonstrate how the principles and concepts described herein can be readily applied to chassis with more than two hoods. The first hood 1102, the second hood 1130, and the third hood 1199 have been moved upward in a removal direction to expose features of the server chassis 1100.

The first hood 1102 includes a hood latch 1106 that is configured to engage with the pin 1104 when the first hood 1102 is in a first-hood closed position (e.g., as described with respect to FIGS. 1-10). Also, when the first hood 1102 is in the first-hood closed position, forms on the inner side of ridge 1140 engage with the L-shaped cutouts 1111, 1112 on a first section of the base ridge 1110 to prevent the hood 1102 from moving in a removal direction. Similarly, forms on the inner side of ridge 1150 engage with L-shaped cutout 1121 and another L-shaped cutout (not shown) on a first section of the base ridge 1120 to prevent the hood 1102 from moving in a removal direction. A J-shaped flange 1181 on the back edge of the first hood 1102 engages with a flange 1182 on the front edge of the second hood 1130 to pull the second hood 130 forward when the first hood 1102 moves in the forward direction 1101A from a first-hood-open position to a first-hood closed position. Also, the first hood 1102 overlays a first portion of the opening 1103 when the first hood 1102 is in the first-hood closed position.

The second hood 1130 overlays a second portion of the opening 1103 when the second hood 1130 is in a forward-closed position. A form on the inner side of the ridge 1160 engages with a T-shaped cutout 1113 on a second section of the base ridge 1110 to prevent the second hood 1130 from moving in the removal direction when the second hood 1130 is in the forward-closed position or a backward-closed position. Similarly, a form on the inner side of ridge 1170 engages with a T-shaped cutout (not shown) on a second section of the base ridge 1120 to prevent the second hood 1130 from moving in the removal direction when the second hood 1130 is in the forward-closed position or a backward-closed position.

The back edge of the second hood 1130 also includes a J-shaped flange 1183 that engages with the flange 1184 on the front edge of the third hood 1199 to pull the third hood 1199 in the forward direction 1101A when the second hood 1130 moves from the backward-closed position to the second-hood open position or from the second-hood open position to the forward-closed position.

The third hood 1199 overlays a third portion of the opening 1103 when the third hood is in an ultimate-forward-closed position (as is described in greater detail with respect to FIG. 12 below). A form on the inner side of the ridge 1191 engages with the T-shaped cutout 1114 on a third section of the base ridge 1110 to prevent the third hood 1199 from moving in the removal direction when the third hood 1199 is in any of three possible closed positions (as described in further detail with respect to FIG. 12). Similarly, a form on the inner side of the ridge 1192 engages with a T-shaped cutout (not shown) on a third section of the base ridge 1120 to prevent the third hood 1199 from moving in the removal direction when the third hood 1199 is in any of three possible closed positions.

Figure 12:
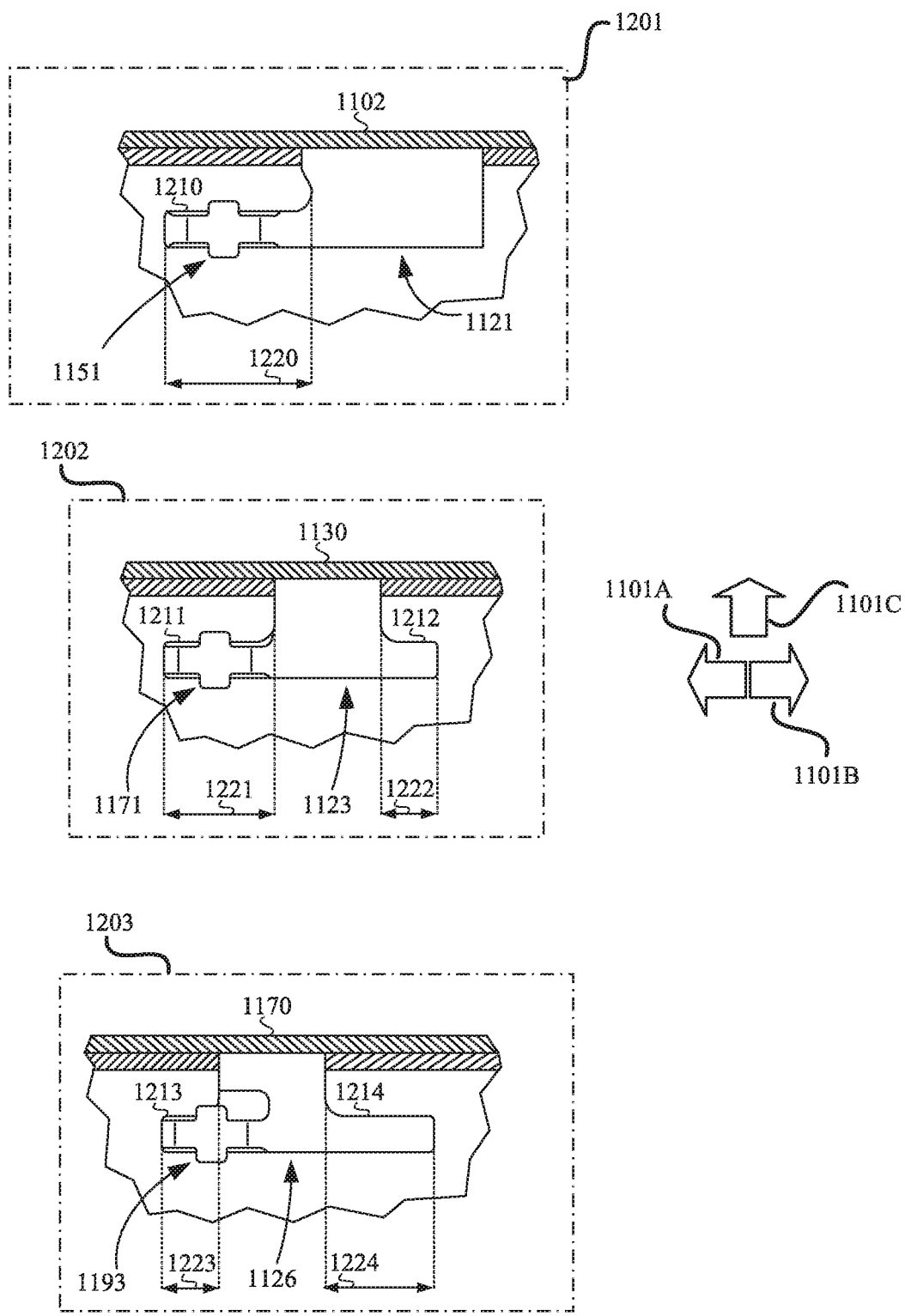
FIG. 12 provides partial cutaway views of a server chassis sliced along the inner side of a base ridge when a first hood 1 is in a first-hood-closed position, a second hood is in a forward-closed position, and a third hood is in an ultimate-forward-closed position, according to an example.

FIG. 12 provides partial cutaway views of the server chassis 1100 sliced along the inner side of the base ridge 1120 when the first hood 1102 is in the first-hood-closed position, the second hood 1130 is in a forward-closed position, and the third hood 1199 is in an ultimate-forward-closed position, according to an example.

Viewing area 1201 provides a partial cutaway view of the L-shaped cutout 1121 when the first hood 1102 is in the first-hood-closed position. The L-shaped cutout 1121 includes a recess 1210 of a width 1220. The form 1151 (which is disposed along the ridge 1150 shown in FIG. 11) rests in the recess 1210 as shown when the first hood 1102 is in the first-hood-closed position. As a result, the L-shaped cutout 1121 engages with the form 1151 to prevent the form 1151 (and the first hood 1102) from moving in the removal direction 1101C.

Viewing area 1202 provides a partial cutaway view of the T-shaped cutout 1123 (which is disposed along a second section of the base ridge 1120 shown in FIG. 11) when the second hood 1130 is in the forward-closed position. The T-shaped cutout 1123 includes a front recess 1211 of a width 1221 and a rear recess 1212 of a width 1222. The form 1171 (which is disposed along the ridge 1170 shown in FIG. 11) rests in the front recess 1211 as shown when the second hood 1130 is in the forward-closed position. As a result, the T-shaped cutout 1123 engages with the form 1171 to prevent the form 1171 (and the second hood 1130) from moving in the removal direction 1101C.

Viewing area 1203 provides a partial cutaway view of the T-shaped cutout 1126 (which is disposed along a third section of the base ridge 1120 shown in FIG. 11) when the third hood 1199 is in the ultimate-forward-closed position. The T-shaped cutout 1126 includes a front recess 1213 of a width 1223 and a rear recess 1214 of a width 1224. The form 1193 (which is disposed along the ridge 1192 shown in FIG. 11) rests in the front recess 1213 as shown when the third hood 1199 is in the ultimate-forward-closed position. As a result, the T-shaped cutout 1126 engages with the form 1193 to prevent the form 1193 (and the third hood 1199) from moving in the removal direction 1101C.

Figure 13:
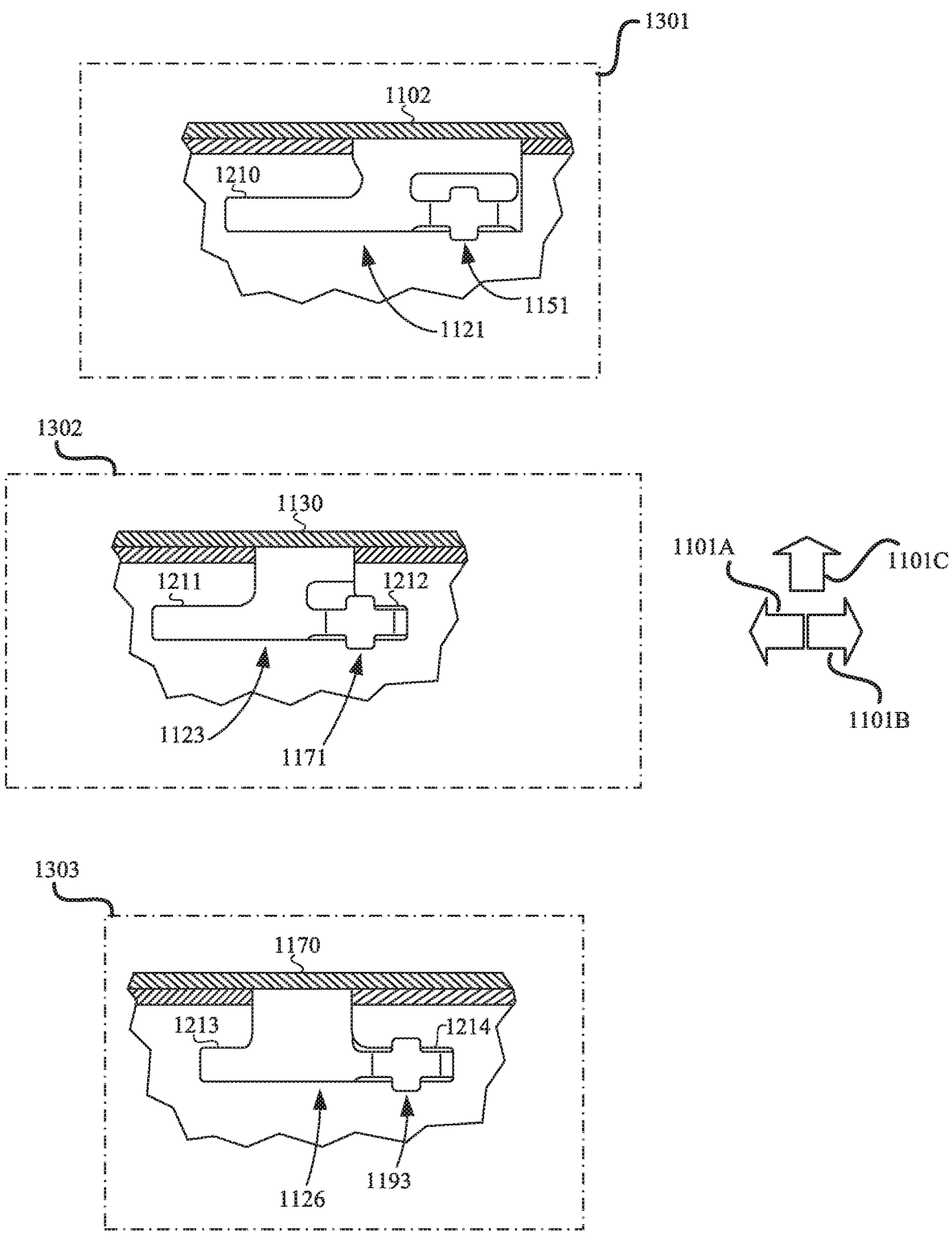
FIG. 13 provides partial cutaway views of a server chassis sliced along the inner side of a base ridge when a first hood is in a first-hood-open position, a second hood is in a backward-closed position, and a third hood is in an ultimate-backward-closed position, according to an example.

With respect to the L-shaped cutout 1121, the width 1220 of the recess 1210 may be greater than the width 1222, greater than the width 1223, greater than the width 1221, and greater than the width 1224. For example, the ratio of the width 1220 to the width 1222 may be between 2.7 and 3.2. Such a ratio may ensure that the first hood 1102 cannot be removed before the form 1171 slides into the rear recess 1212 (as shown in FIG. 13).

As shown, the width 1221 of the front recess 1211 may be larger than the width 1222 of the rear recess 1212 of the T-shaped cutout 1123. The ratio of the width 1221 to the width 1222 may be, for example, between 1.8 and 2.2.

Figure 14:
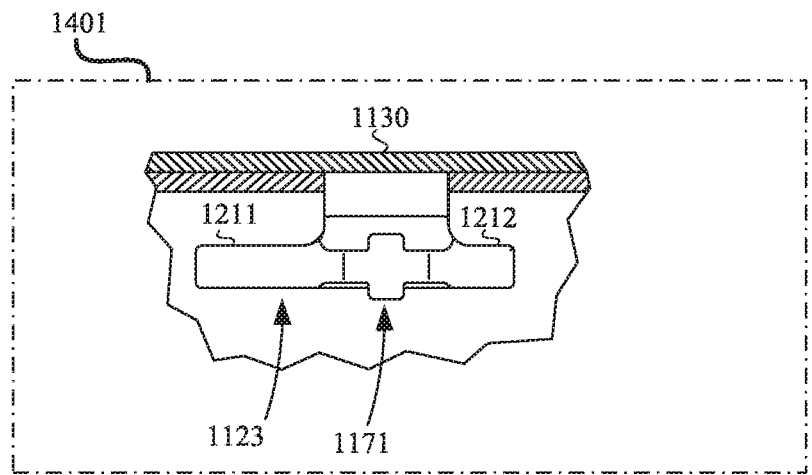
FIG. 14 provides partial cutaway views of a server chassis sliced along the inner side of a base ridge when a second hood is in a second-hood-open position and a third hood is in a penultimate-backward-closed position, according to an example.
Figure 14:
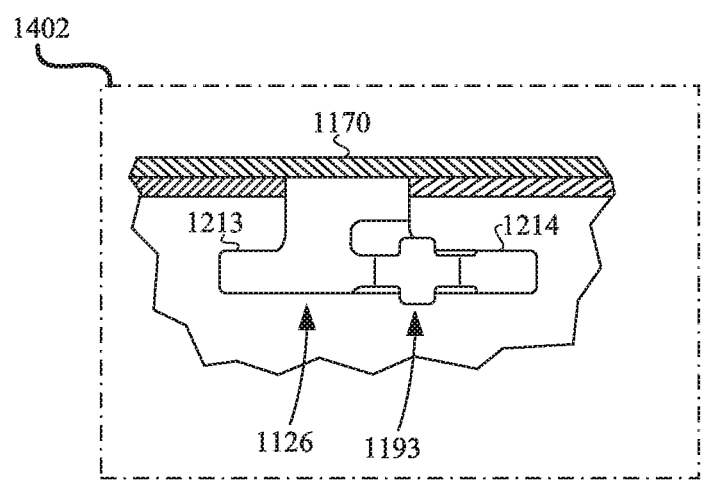
Figure 14:
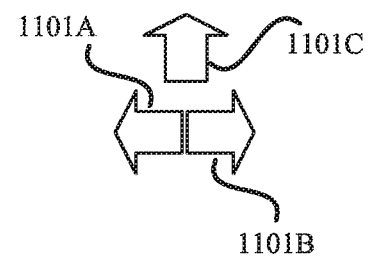

With respect to the T-shaped cutout 1126, the width 1223 of the front recess 1213 may be less than the width 1224 of the rear recess 1214. The ratio of the width 1224 to the width 1223 may be, for example, between 1.8 and 2.2. This ratio may ensure that the second hood 1170 may not be removed until the form 1193 rests in the rear recess 1214 (e.g., as shown in FIG. 14). Note that, in some examples, the width 1224 may equal the width 1221 and the width 1223 may equal the width 1222.

In one example, a formula can be used to determine the widths of cutout recesses for a chassis that has multiple hoods. If there are n hoods (where n is a natural number greater than zero), let $H_k$ represent the $k^{th}$ hood (0<k<n, k is an integer), where $H_1$ represents a first hood (e.g., the hood on which a latch is found). Let $F_{H,k}$ be the width of the front recess for a cutout on a base ridge that underlays a ridge of $H_k$ and let $R_{H,k}$ be the width of the rear recess for the cutout. Also let M equal the movement distance for the hood latch on $H_1$. $F_{H,k}$ can be defined by the equation $$F_{H,k} = (n - k + 1) \cdot \frac{M}{n}$$

while $R_{H,k}$ can be defined by the equation $$R_{H,k} = (k - 1) \cdot \frac{M}{n}$$

Note that these equations result in a rear-recess width of zero for $R_{H,1}$, which causes the first cutout to be L-shaped rather than T-shaped.

FIG. 13 provides partial cutaway views of the server chassis 1100 sliced along the inner side of the base ridge 1120 when the first hood 1102 is in the first-hood-open position, the second hood 1130 is in the backward-closed position, and the third hood 1199 is in an ultimate-backward-closed position, according to an example.

When the handle 1107 (shown in FIG. 11) is rotated to the handle-open position, the first hood 1102 slides in the backward direction 1101C by a movement distance. The back edge of the first hood 1102 pushes the front edge of the second hood 1130 and the back edge of the second hood 1130 pushes the front edge of the third hood 1199, so the second hood 1130 and the third hood 1199 also shift in the backward direction 1101C by the movement distance. As a result, the form 1151, the form 1171, and the form 1193 shift to the positions shown in the viewing area 1301, viewing area 1302, and viewing area 1303, respectively.

Viewing area 1301 provides a partial cutaway view of the L-shaped cutout 1121 when the first hood 1102 is in the first-hood-open position. The form 1151 no longer rests in the recess 1210, so the L-shaped cutout 1121 does not prevent the form 1151 (or the first hood 1102) from moving in the removal direction 1101C. Thus, the first hood 1102 can be rotated upward about an axis parallel to the back edge of the first hood 1102 and removed.

Viewing area 1302 provides a partial cutaway view of the T-shaped cutout 1123 when the second hood 1130 is in the backward-closed position. The form 1171 rests in the rear recess 1212 as shown when the second hood 1130 is in the backward-closed position. As a result, the T-shaped cutout 1123 engages with the form 1171 to prevent the form 1171 (and the second hood 1130) from moving in the removal direction 1101C.

Viewing area 1303 provides a partial cutaway view of the T-shaped cutout 1126 when the third hood 1199 is in the ultimate-backward-closed position. The form 1193 rests in the rear recess 1214 as shown when the third hood 1199 is in the ultimate-backward-closed position. As a result, the T-shaped cutout 1126 engages with the form 1193 to prevent the form 1193 (and the third hood 1199) from moving in the removal direction 1101C.

FIG. 14 provides partial cutaway views of the server chassis 1100 sliced along the inner side of the base ridge 1120 when the second hood 1130 is in the second-hood-open position and the third hood 1199 is in a penultimate-backward-closed position, according to an example.

After the first hood 1102 is removed, the second hood 1130 can be slid in the forward direction 1101A by a second distance that is shorter than the movement distance such that the form 1171 on the second hood 1130 moves forward within the T-shaped cutout 1123 to the position shown in viewing area 1401. The J-shaped flange 1183 (shown in FIG. 11) on the back edge of the second hood 1130 engages the flange 1184 on the front edge of the third hood 1199 to pull the third hood 1199 forward by the second distance, which causes the form 1193 to move forward within the T-shaped cutout 1126 to the position shown in viewing area 1402.

Viewing area 1401 provides a partial cutaway view of the T-shaped cutout 1123 when the second hood 1130 is in the second-hood-open position. As shown in viewing area 1401, the form 1171 rests in neither the front recess 1211 nor the rear recess 1212 when the second hood 1130 is in the second-hood-open position. As a result, the T-shaped cutout 1123 does not engage with the form 1171 to prevent the form 1171 (and the second hood 1130) from moving in the removal direction 1101C. Thus, the second hood 1170 can be removed by rotating the second hood 1130 upward about an axis parallel to the back edge of the second hood 1130 and pulling the back edge of the second hood 1130 away from the front edge of the third hood 1199.

Viewing area 1402 provides a partial cutaway view of the T-shaped cutout 1126 when the third hood 1199 is in the penultimate-backward-closed position. As shown in viewing area 1402, the form 1193 still rests in the rear recess 1214. As a result, the T-shaped cutout 1126 engages with the form 1193 to prevent the form 1193 (and the third hood 1199) from moving in the removal direction 1101C.

Figure 15:
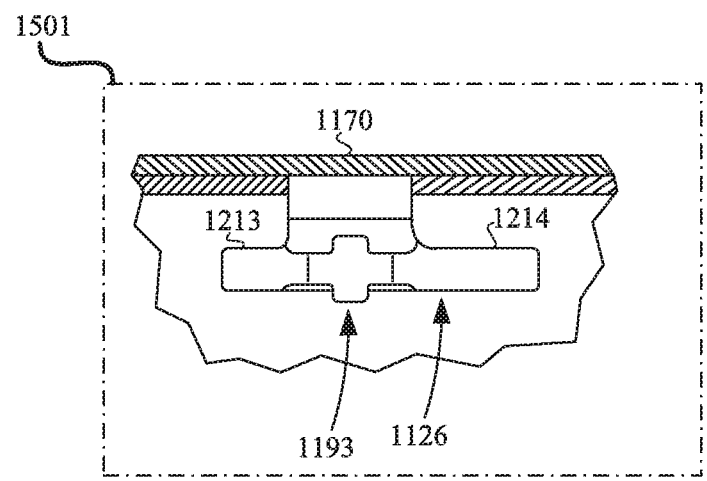
FIG. 15 provides a partial cutaway view of a server chassis sliced along the inner side of a base ridge when a third hood is in a third-hood-open position, according to an example.
Figure 15:
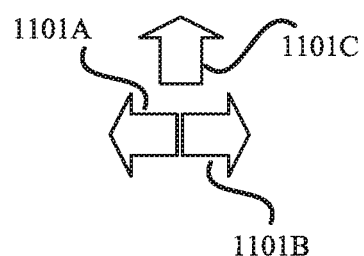

FIG. 15 provides a partial cutaway view of the server chassis 1100 sliced along the inner side of the base ridge 1120 when the third hood 1199 is in a third-hood-open position, according to an example.

After the second hood 1170 is removed, the third hood 1199 can be slid in the forward direction 1101A by a third distance that is shorter than the movement distance such that the form 1193 on the third hood 1170 moves forward within the T-shaped cutout 1126 to the position shown in viewing area 1501.

Viewing area 1501 provides a partial cutaway view of the T-shaped cutout 1126 when the third hood 1170 is in the third-hood-open position. As shown in viewing area 1501, the form 1193 rests in neither the front recess 1213 nor the rear recess 1214 when the second hood 1170 is in the third-hood-open position. As a result, the T-shaped cutout 1126 does not engage with the form 1193 to prevent the form 1193 (and the third hood 1170) from moving in the removal direction 1101C. Thus, the second hood 1170 can be removed.

Examples

The following additional examples are included below to highlight several aspects of apparatuses and methods described herein. However, the scope of the disclosure is not limited to these additional examples or the other examples described herein.

Example 1 includes an apparatus comprising: a base portion, wherein the base portion comprises: an opening; a base ridge comprising a first section and a second section; an L-shaped cutout disposed along the first section of the base ridge; and a T-shaped cutout disposed along the second section of the base ridge, the T-shaped cutout including a front recess and a rear recess.

Example 2 includes the apparatus of example 1, further comprising: a first hood that overlays a first portion of the opening when the first hood is in a first-hood-closed position, wherein the first hood comprises: a first-hood ridge that overlays the first section of the base ridge when the first hood is in the first-hood-closed position; a first form that rests in a recess of the L-shaped cutout when the first hood is in the first-hood-closed position and engages with the L-shaped cutout to prevent the first hood from moving away from the base portion in a removal direction orthogonal to a cross-sectional plane of the opening when the first hood is in the first-hood-closed position; and a J-shaped flange on a back edge of the first hood, wherein the J-shaped flange partially encloses a concave region.

Example 3 includes the apparatus of example 2, further comprising: a second hood that overlays a second portion of the opening when the second hood is in a forward-closed position, wherein the second hood comprises: a second ridge that overlays the second section of the base ridge when the second hood is in the forward-closed position; a second form that rests in the front recess of the T-shaped cutout when the second hood is in the forward-closed position and rests in the rear recess of the T-shaped cutout when the second hood is in a backward-closed position, wherein the second form engages with the T-shaped cutout to prevent the second hood from moving away from the base portion in the removal direction when the second hood is in the forward-closed position and when the second hood is in the backward-closed position; and a second flange on a front edge of the second hood, wherein the second flange rests in the concave region partially enclosed by the J-shaped flange when the second hood is in the forward-closed position and the first hood is in the first-hood-closed position, and wherein the second flange engages with the J-shaped flange to pull the second hood from the backward-closed position to the forward-closed position when the first hood slides from a first-hood-open position to the first-hood-closed position.

Example 4 includes the apparatus of example 1, 2, or 3, wherein a width of the recess of the L-shaped cutout is greater that a width of the front recess of the T-shaped cutout.

Example 5 includes the apparatus of example 1, 2, 3, or 4, wherein ratio of a sum of the width of the front recess and a width of the rear recess to a width of the recess of the L-shaped cutout is between 0.85 and 1.20.

Example 6 includes the apparatus of example 1, 2, 3, 4, or 5, wherein the second hood further comprises a second J-shaped flange on a back edge of the second hood, and wherein the apparatus further comprises: a second T-shaped cutout disposed along a third section of the base ridge, the second T-shaped cutout including a second front recess and a second rear recess; and a third hood that overlays a third portion of the opening when the third hood is in a ultimate-forward-closed position, wherein the third hood comprises: a third-hood ridge that overlays the third section of the base ridge when the third hood is in the ultimate-forward-closed position; a third form that rests in the second front recess of the second T-shaped cutout when the third hood is in the ultimate-forward-closed position and rests in the second rear recess of the second T-shaped cutout when the third hood is in an ultimate-backward-closed position, wherein the third form engages with the second T-shaped cutout to prevent the third hood from moving away from the base portion in the removal direction when the third hood is in the ultimate-forward-closed position, when the third-hood is in the ultimate-backward-closed position, and when the third hood is in a penultimate-backward-closed position; and a third flange on a front edge of the third hood, wherein an edge of the third flange rests in a second concave region partially enclosed by the second J-shaped flange when the third hood is in the ultimate-forward-closed position and the first hood is in the first-hood-closed position, and wherein the third flange engages with the second J-shaped flange to pull the third hood from the ultimate-backward-closed position to the penultimate-backward-closed position when the second hood slides from the backward-closed position to a second-hood-open position.

Example 7 includes the apparatus of example 6, wherein a ratio of a width of the second rear recess to a width of the rear recess is between 1.8 and 2.2.

Example 8 includes the apparatus of example 6 or 7, wherein a ratio of a width of the recess of the L-shaped cutout to a width of the rear recess is between 2.7 and 3.2.

Example 9 includes the apparatus of example 1, 2, 3, 4, 5, 6, 7, or 8, wherein: the base portion further comprises a hood latch pin; and the first hood further comprises a hood latch that engages with the hood latch pin when the first hood is in the first-hood-closed position.

Example 10 includes the apparatus of example 1, 2, 3, 4, 5, 6, 7, 8, or 9, wherein the J-shaped flange extends across a full length of the back edge of the first hood.

Example 11 includes the apparatus of example 3, 4, 5, 6, 7, 8, 9, or 10, wherein the second flange extends across a full length of the front edge of the second hood.

Example 12 includes a method for opening a chassis, the method comprising: lifting a handle of a hood latch positioned on a first hood of the chassis, wherein lifting the handle causes the first hood to slide backward by a movement distance, and wherein a back edge of the first hood pushes a front edge of a second hood of the chassis backward by the movement distance; and rotating the first hood upward about an axis parallel to a back edge of the first hood until a flange on the front edge of the second hood exits a concave region partially enclosed by a J-shaped flange on the back edge of the first hood, wherein a form on a ridge of the second hood engages with a rear recess of a T-shaped cutout in a base ridge of the chassis to prevent the second hood from moving in a removal direction when the first hood is rotated.

Example 13 includes the method of example 12, further comprising: removing the first hood by pulling the back edge of the first hood away from the front edge of the second hood.

Example 14 includes the method of example 13, further comprising: sliding the second hood forward by a distance that is no greater than half the movement distance.

Example 15 includes the method of example 14, further comprising: rotating the second hood upward about an axis parallel to a back edge of the second hood until a second flange on a front edge of a third hood exits a second concave region partially enclosed by a second J-shaped flange on the back edge of the second hood, wherein a form on a ridge of the third hood engages with a second rear recess of a second T-shaped cutout in the base ridge of the chassis to prevent the third hood from moving in the removal direction when the second hood is rotated.

Example 16 includes the method of 15, further comprising: removing the second hood by pulling the back edge of the second hood away from the front edge of the third hood.

Example 17 includes the method of example 16, further comprising: sliding the third hood forward by a distance that is no greater than one third of the movement distance.

Example 18 includes the method of example 17, further comprising: removing the third hood by moving the third hood in the removal direction.

Example 19 includes an apparatus comprising: a base portion comprising an opening; a first hood including a J-shaped flange on a back edge of the first hood; and a second hood including a second flange on a front edge of the second hood, wherein the second flange rests in a concave region partially enclosed by the J-shaped flange.

Example 20 includes the apparatus of example 19, wherein: the J-shaped flange extends across a full length of the back edge of the first hood; and the second flange extends across a full length of the front edge of the second hood.

While the present apparatuses and systems may be susceptible to various modifications and alternative forms, the embodiments discussed above have been provided only as examples. It is to be understood that the apparatuses and systems are not intended to be limited to the particular examples disclosed herein. Indeed, the present apparatuses and systems include all alternatives, modifications, and equivalents falling within the true spirit and scope of the appended claims.

What is claimed is:

1. An apparatus comprising:
    a base portion, wherein the base portion comprises:
        an opening;
        a base ridge comprising a first section and a second section;
        an L-shaped cutout disposed along the first section of the base ridge; and
        a T-shaped cutout disposed along the second section of the base ridge, the T-shaped cutout including a front recess and a rear recess; and
    a first hood that overlays a first portion of the opening when the first hood is in a first-hood-closed position, wherein the first hood comprises:

a ridge that overlays the first section of the base ridge when the first hood is in the first-hood-closed position;

a first form that rests in a recess of the L-shaped cutout when the first hood is in the first-hood-closed position and engages with the L-shaped cutout to prevent the first hood from moving away from the base portion in a removal direction orthogonal to a cross-sectional plane of the opening when the first hood is in the first-hood-closed position; and a J-shaped flange on a back edge of the first hood, wherein the J-shaped flange partially encloses a concave region.

2. The apparatus of claim 1, further comprising:

a second hood that overlays a second portion of the opening when the second hood is in a forward-closed position, wherein the second hood comprises:

a second ridge that overlays the second section of the base ridge when the second hood is in the forward-closed position;

a second form that rests in the front recess of the T-shaped cutout when the second hood is in the forward-closed position and rests in the rear recess of the T-shaped cutout when the second hood is in a backward-closed position, wherein the second form engages with the T-shaped cutout to prevent the second hood from moving away from the base portion in the removal direction when the second hood is in the forward-closed position and when the second hood is in the backward-closed position; and a second flange on a front edge of the second hood, wherein the second flange rests in the concave region partially enclosed by the J-shaped flange when the second hood is in the forward-closed position and the first hood is in the first-hood-closed position, and wherein the second flange engages with the J-shaped flange to pull the second hood from the backward-closed position to the forward-closed position when the first hood slides from a first-hood-open position to the first-hood-closed position.

3. The apparatus of claim 2, wherein the second hood further comprises a second J-shaped flange on a back edge of the second hood, and wherein the apparatus further comprises:

a second T-shaped cutout disposed along a third section of the base ridge, the second T-shaped cutout including a second front recess and a second rear recess; and a third hood that overlays a third portion of the opening when the third hood is in a ultimate-forward-closed position, wherein the third hood comprises:

a third-hood ridge that overlays the third section of the base ridge when the third hood is in the ultimate-forward-closed position;

a third form that rests in the second front recess of the second T-shaped cutout when the third hood is in the ultimate-forward-closed position and rests in the second rear recess of the second T-shaped cutout when the third hood is in an ultimate-backward-closed position, wherein the third form engages with the second T-shaped cutout to prevent the third hood from moving away from the base portion in the removal direction when the third hood is in the ultimate-forward-closed position, when the third-hood is in the ultimate-backward-closed position, and when the third hood is in a penultimate-backward-closed position; and a third flange on a front edge of the third hood, wherein an edge of the third flange rests in a second concave region partially enclosed by the second J-shaped flange when the third hood is in the ultimate-forward-closed position and the first hood is in the first-hood-closed position, and wherein the third flange engages with the second J-shaped flange to pull the third hood from the ultimate-backward-closed position to the penultimate-backward-closed position when the second hood slides from the backward-closed position to a second-hood-open position.

4. The apparatus of claim 3, wherein a ratio of a width of the second rear recess to a width of the rear recess is between 1.8 and 2.2.

5. The apparatus of claim 4, wherein a ratio of a width of the recess of the L-shaped cutout to a width of the rear recess is between 2.7 and 3.2.

6. The apparatus of claim 2, wherein the second flange extends across a full length of the front edge of the second hood.

7. The apparatus of claim 1, wherein a width of a recess of the L-shaped cutout is greater that a width of the front recess of the T-shaped cutout.

8. The apparatus of claim 1, wherein a ratio of a sum of the width of the front recess and a width of the rear recess to a width of a recess of the L-shaped cutout is between 0.85 and 1.20.

9. The apparatus of claim 1, wherein:

the base portion further comprises a hood latch pin; and the first hood further comprises a hood latch that engages with the hood latch pin when the first hood is in the first-hood-closed position.

10. The apparatus of claim 1, wherein the J-shaped flange extends across a full length of the back edge of the first hood.

11. A method for opening a chassis, the method comprising:

lifting a handle of a hood latch positioned on a first hood of the chassis, wherein lifting the handle causes the first hood to slide backward by a movement distance, and wherein a back edge of the first hood pushes a front edge of a second hood of the chassis backward by the movement distance; and rotating the first hood upward about an axis parallel to a back edge of the first hood until a flange on the front edge of the second hood exits a concave region partially enclosed by a J-shaped flange on the back edge of the first hood, wherein a form on a ridge of the second hood engages with a rear recess of a T-shaped cutout in a base ridge of the chassis to prevent the second hood from moving in a removal direction when the first hood is rotated.

12. The method of claim 11, further comprising:

removing the first hood by pulling the back edge of the first hood away from the front edge of the second hood.

13. The method of claim 12, further comprising:

sliding the second hood forward by a distance that is no greater than half the movement distance.

14. The method of claim 13, further comprising:

rotating the second hood upward about an axis parallel to a back edge of the second hood until a second flange on a front edge of a third hood exits a second concave region partially enclosed by a second J-shaped flange on the back edge of the second hood, wherein a form on a ridge of the third hood engages with a second rear recess of a second T-shaped cutout in the base ridge of the chassis to prevent the third hood from moving in the removal direction when the second hood is rotated.

15. The method of 14, further comprising:

removing the second hood by pulling the back edge of the second hood away from the front edge of the third hood.

16. The method of claim 15, further comprising:

sliding the third hood forward by a distance that is no greater than one third of the movement distance.

17. The method of claim 16, further comprising:

removing the third hood by moving the third hood in the removal direction.

\* \* \* \* \*